(12) United States Patent
Ledenev et al.

(10) Patent No.: US 8,924,169 B1
(45) Date of Patent: Dec. 30, 2014

(54) ELECTRICAL ARC DETECTION METHODS AND APPARATUS

(71) Applicant: AMPT, LLC, Fort Collins, CO (US)

(72) Inventors: Anatoli Ledenev, Fort Collins, CO (US); Wesley R. Fuller, Fort Collins, CO (US)

(73) Assignee: AMPT, LLC, Fort Collins, CO (US)

( * ) Notice: Subject to any disclaimer, the term of this patent is extended or adjusted under 35 U.S.C. 154(b) by 86 days.

(21) Appl. No.: 13/801,705

(22) Filed: Mar. 13, 2013

Related U.S. Application Data

(60) Provisional application No. 61/617,431, filed on Mar. 29, 2012, provisional application No. 61/703,555, filed on Sep. 20, 2012.

(51) Int. Cl.
G01R 31/00 (2006.01)
G01R 31/12 (2006.01)

(52) U.S. Cl.
CPC .................................. G01R 31/1227 (2013.01)
USPC ............................................. 702/58; 361/93.2

(58) Field of Classification Search
USPC .......................................................... 702/58
See application file for complete search history.

(56) References Cited

U.S. PATENT DOCUMENTS

| 5,648,731 | A | 7/1997 | Decker et al. |
| 6,191,501 | B1 | 2/2001 | Bos |
| 7,786,716 | B2 | 8/2010 | Simburger et al. |
| 2005/0203672 | A1* | 9/2005 | Restrepo et al. ............... 700/293 |
| 2008/0204950 | A1* | 8/2008 | Zhou et al. ....................... 361/42 |
| 2008/0238195 | A1 | 10/2008 | Shaver et al. |
| 2010/0308662 | A1* | 12/2010 | Schatz et al. ..................... 307/80 |
| 2011/0141644 | A1* | 6/2011 | Hastings et al. .............. 361/93.2 |

FOREIGN PATENT DOCUMENTS

WO 2009051870 A1 4/2009

OTHER PUBLICATIONS

U.S. Appl. No. 61/617,431, filed Mar. 29, 2012, entitled High Resolution and Precision Arc Detection Methods and Apparatus for Fire Prevention and Reduction of False Positives.
U.S. Appl. No. 61/703,555, filed Sep. 20, 2012, entitled, Improved Solar Power Systems Data Handling Methods.

* cited by examiner

Primary Examiner — Patrick Assouad
Assistant Examiner — Haidong Zhang
(74) Attorney, Agent, or Firm — Santangelo Law Offices, P.C.

(57) ABSTRACT

In at least one embodiment, the inventive technology may involve arc detection methods and apparatus for use in photovoltaic power systems. One general aspect may involve the determination of lower noise regions of a fourier transformation of a parameter (e.g., voltage, current or power) signal measurement at a location in the system, and a comparison of fourier transformed signal values at such locations at different times to assess atypical increases in value and thus possible arcing. Polling protocols may be used to further reduce false positives. Certain other aspects may relate to comparison of synchronized voltage measurements to assess presence of arc condition. Any aspect may involve automatic, positive arc condition response circuitry that acts to automatically mitigate undesired effects of an arc in the event of arc detection.

6 Claims, 7 Drawing Sheets

US 8,924,169 B1

ELECTRICAL ARC DETECTION METHODS AND APPARATUS

CROSS-REFERENCE TO RELATED APPLICATION(S)

This US non-provisional patent application claims priority to U.S. provisional patent application 61/617,431, filed Mar. 29, 2012, entitled, "High Resolution and Precision Arc Detection Methods and Apparatus for Fire Prevention and Reduction of False Positives", and U.S. provisional patent application 61/703,555, filed Sep. 20, 2012, entitled, "Improved Solar Power Systems Data Handling Methods", each of said provisional applications incorporated herein in its entirety by reference.

BACKGROUND

There is a need to detect arcs in a system (e.g., a power generation system, such as a solar power generation system or photovoltaic system, as but one example) at a higher resolution than at the encompassing system level. An ability to detect arcs at a higher resolution will provide not only greater capability to detect the arcs, but a great ability to locate them as well. One major hurdle to be overcome is that as a system grows in size and complexity, the ability to detect an arc decreases, especially in the case where the arc is far away from the detector.

A good example of a system that may benefit from the inventive technology disclosed herein is a photovoltaic field that has inverters, DC-DC converters, combiner boxes, cables, homerun diodes, photovoltaic panels, disconnect switches, and other common components. These components combine together to make not only a functioning power system, but a resonant and filtering circuit as well. To reduce the effects of the filtering and resonance of the system, it is proposed to place detection circuitry comprising, in some embodiments, both analog and digital components at the string level, multi-string level, and/or panel (or module) level of the system (note that the term module may include solar panels, converters, and/or other componentry). These locations, combined with a high precision measurement, may increase the capability of detecting an arc, locating it, and/or reduce the chances of false positives. They also may allow for continued functioning of the system after an arc, although at a reduced capacity, by allowing for shutdown only of the precisely located and correctly identified "arced" string (i.e., without having to shut down the entire system).

DESCRIPTION OF THE INVENTIVE TECHNOLOGY

Figure 1:
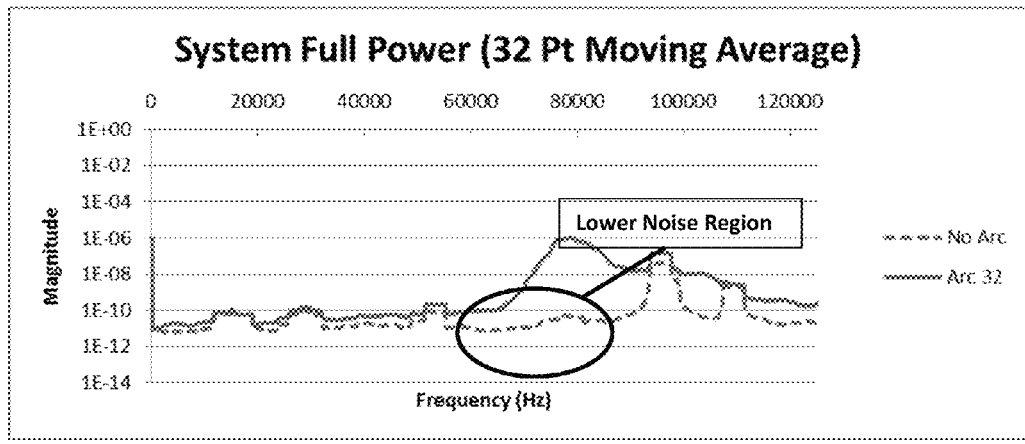
FIG. 1 shows an example of a graph of signal magnitude (decibels) in the frequency domain for a photovoltaic system operating at full power.

As can be easily understood from the foregoing, the basic concepts of the present invention may be embodied in a variety of ways. It involves both arc detection techniques as well as devices to accomplish the arc detection. In this application, the detection techniques are disclosed as part of the results shown to be achieved by the various devices described and as steps which are inherent to utilization. They are simply the natural result of utilizing the devices as intended and described. In addition, while some devices are disclosed, it should be understood that these not only accomplish certain methods but also can be varied in a number of ways. Importantly, as to all of the foregoing, all of these facets should be understood to be encompassed by this disclosure.

Several conventional circuit topologies are capable of achieving the goal of detecting an arc signature, but the circuit disclosed herein gives the system the ability to do so reliably and without an increase in false positives. In at least one embodiment, the inventive circuit disclosed herein could include a signal sensing devise such as current shunt (as but one example) which could, for example, be resistive, isolated or magnetic. Current measurement could take place with an ammeter or current transformer. More generally, an electrical parameter measurer could measure current, voltage or power, e.g. Such measurer could include, as by way of example only, a current transformer, an amplifier, a voltage transformer and/or a power measurer. Note that the term measure is a general term, including simply sensing so that the sensed signal can be manipulated in some fashion by a microprocessor. The circuit could also include multiple band-pass filters and/or amplifiers (e.g., programmable gain), and at least one microprocessor capable of performing software analysis on the acquired signal. It is of note that even where expressed using different terms (e.g., a comparator and a microprocessor), the indicated functionalities may both be performed by the microprocessor.

One example of analysis could include performing an FFT (Fast Fourier Transform, an example of a mathematical transform, typically done through the use of a programmed computer, regardless of size, which is a type of "at least one microprocessor) of a measured signal reading (perhaps taken by a current transformer) in the time domain to generate (e.g., yield, produce or output) a frequency domain representation of that signal (e.g., a spectral density). Such measured signal(s) may be amplified by an amplifier as necessary (note that the electrical parameter measurer may at time inherently amplify the measured parameter also) to produce an amplified signal(s) (a type of measured signal). The circuit could then identify one or more lower noise regions in that spectral density (e.g., through dynamic searching done during a prior or a current arc inquiry cycle, and recalling locations of lower noise region(s) as necessary) and monitor such regions over time for a signal increase that is large enough to suggest arcing (e.g., a jump that is not typically seen during normal, non-arc condition). In order to identify a lower noise region(s) in at least one embodiment, the circuit could dynamically search for frequency region(s) (e.g., limited width frequency ranges) with the lowest amount of noise or value on the spectral density; such dynamic searching would be a form of updating or resetting the locations of lower noise region(s) and may be done either as frequently as possible (e.g., every arc inquiry cycle), or less frequently. At times, an analysis would reveal such region by determining which frequency region had the lowest average signal (e.g., over a range of frequencies at a certain time) of the plurality of signal values (e.g., each substantially at a single frequency) within a certain window (e.g., a 100 kHz window as but one of many possible windows). Where desired, one such lower noise region could be identified for each of a plurality of search bands. However, this is but one way to determine a lower noise area; one of many other possible procedures involves merely finding the lowest signal in the entire measured frequency range. In fact, in certain embodiments, the lower noise regions may be predetermined for a system; identification of such regions in such system would not involve mathematically transformed signal analysis. But this is a less preferred embodiment; typically, the lower noise region(s) (e.g., each a frequency range or even a single frequency) are determined by analysis to determine which region(s) show lower noise. If that analysis occurred during a previous or earlier cycle and is to be used for a current cycle, then the location of that lower noise region would be recalled also. Note that the time between the end of one arc inquiry cycle and the start of the next inquiry cycle (unmeasured time gap) may be as short as possible or it may have other value; it may be different from the width (or length of time) of the window during which a parameter is measured, or it may be the same (indeed, such values are typically independent).

The circuit could be adaptive in that it may re-evaluate whether the immediately prior lower noise region(s) are still lower noise region(s); if not, a new region/band could be labeled as the new lower noise region using any procedure (e.g., one of the aforementioned) to locate it. Such updating could occur as often as often as desired; any such updating, regardless of how often it is done, is an example of identifying at least one lower noise region of the mathematically transformed non-arc condition signal. Also, either involves the selection and analysis of that selected mathematically transformed non-arc condition signal. Adaptive capability (e.g., updating of lower noise regions, instead of using the same lower noise regions for so long that results are compromised), may provide an ability to further mitigate false positives caused by, e.g., introduction of a new, non-arc type noise source in the system (e.g., a new piece of equipment connected after initial operation of the arc detection system). Such selective analysis (where a selected mathematically transformed signal (e.g., a signal every 10 seconds) is selected for analysis) is different from any approaches where the location of the lower noise regions (e.g., the precise frequency range) is hard set/stored as a constraint in the system (perhaps as a result of an initial calibration) and never changed until the system is manually taken off line (e.g., shut down) when a need for lower noise location re-calibration is suspected. In such systems, at this point, a manual recalibration of lower noise location(s) occurs, and a new location(s) is newly hard set. The contrary "automatic" updating of location (e.g., precise frequency range) of lower noise region(s) may occur based on time (e.g., update every fraction of a second, every 1 second, every 5 seconds, every 10 seconds, every minute, every hour, every day, etc.), or based on number of measurements (e.g., update every 10 electrical parameter measurements, every 100 electrical parameter measurements, every 1000 electrical parameter measurements, ever 10E4 electrical parameter measurements, every 10E5 electrical parameter measurements, etc.). Such are ways of selecting a transformed signal to use for determination of lower noise regions; more or less frequent lower noise region identification updating schemes are part of the inventive technology. In such embodiments, the same lower noise region(s) may be used for a plurality of arc inquiries, or arc inquiry cycles (each of which may involve a comparison of signal values for different times at each such lower noise region(s)) and a lower noise region used for a certain detection cycle may have been determined during analysis of a $(n-x)^{th}$ mathematically transformed signal (e.g., where n is a positive integer, and x is a positive integer that may increase each cycle by 1, up to a certain maximum value, at which point the location of the lower noise regions is updated via measurement and analysis as described elsewhere herein). Note that when the location of lower noise regions are updated, this step need not necessarily produce new lower noise regions (perhaps they didn't change), but it certainly may, particularly if, e.g., a user of the power generation circuit added some new circuitry that added noise at a certain frequency, and such certain frequency used to be part of a lower noise region.

It is of note that more than one lower noise region could be identified and monitored. Such may help to reduce false positives in that it may allow for a polling protocol that mitigates the impact of false positives. Whereas in the case of a system that would alert to arc condition when only one area indicates or suggests arc condition (because of a jump in signal as compared with a previous (e.g., an immediately prior) signal), a polling system would alert to arc at a certain measured location in a circuit only when at least a certain percentage (e.g., at least half, at least one third, at least 60%, at least ¾, as but a few of many examples) of certain regions (e.g., lower noise regions) whose signal was monitored indicated arc. Such polling protocol could also mitigate the impact of a region whose noise or signal is so large that an arc is barely noticeable. One of several ways in which this may be done is to identify two or more search bands (the lower frequency half of a spectral density and the upper frequency half of a spectral density; the four quarters of a spectral density; the five fifths of a spectral frequency density, as but a few of many possibilities) and look for a lower noise region(s) (band(s)) in each search band. This lower noise region may be indicated by the lowest average signal of the plurality of signals within a certain window (e.g., a 20 kHz window as but one of many possible windows) in that search band. For example, for a spectral density from 0 to 120 MHz (see, e.g., FIGS. 1 and 2), one may identify 6 search bands (one from 0-20 MHz, one from 20-40 MHz, one from 40-60 MHz, etc.). In each search band, a search for that frequency window (limited width frequency range, LWFR) having the lowest decibel value could be conducted. Typically, the frequency width of the window (LWFR) would be less than or equal to one half of the frequency width of the search band (as such, each search band would have two or more LWFR's in it; the LWFR having the lowest average mathematically transformed signal value could be chosen among all LWFR's in that band as the lower noise region for that band. Where the LWFR is larger than the smallest window possible (the smallest possible window on the spectral density would show a value for a single frequency), an average (of several values, each perhaps for a single frequency) may be necessary to generate a representative value (of the limited width frequency range) with which a comparison of representative values (which also may be averages) of other LWFR's in the particular search band can be made in order to determine which LWFR has the lowest average noise (and therefor which would serve as the lower noise region for the applicable search band). As such, one could identify a lower noise region for each search band. Again, this is but one way to determine the lowest noise area; one of many other possible procedures involves merely finding the lowest signal. And as mentioned, the circuit could be adaptive in that it may re-evaluate whether an earlier lower noise region(s) of each respective search band are still lower noise region(s); if not, a new region(s) could be labeled the new lower noise region(s) using any procedure (e.g., one of the aforementioned) to locate it.

Once the lower noise area(s)/regions(s) has been located, the circuit could monitor the region(s), looking for an increase in the mathematically transformed signal. This could be done via measuring an electrical parameter at a later time (e.g., a time after a mathematically transformed, non-arc condition signal value for each lower noise region is identified) to generate a later measured signal, then mathematically transforming that later measured signal to generate a mathematically transformed later signal, then determining a value of that transformed signal at each of the lower noise region(s), and comparing that value, for each lower noise region(s) with a respective (i.e., associated with the same lower noise region) mathematically transformed, non-arc condition signal value. This comparison could be of current, voltage, or power in the frequency domain, relative to, e.g., the immediately prior signal, or a baseline signal value. A change in the signal that is significant enough would suggest arc; if more than one lower noise bands/regions were monitored, then if at least a certain percentage of them showed signal jumps that suggested arc (e.g., jumps of at least a certain amount), an arc alert would be issued. Of course, the compared signals must be of the same parameter (e.g., noise on a current line); preferably, they would also be mathematically comparable (e.g., if the first signal in the lower noise band of a respective search band is an average of signals of frequencies within that lower noise band, then a later measurement that is compared to such first signal should also preferably be an average). A comparator (a broad term, perhaps referring only to a microprocessor's ability to make such comparison) may be used in any embodiment to make any necessary comparisons; a microprocessor configured to compare values is in effect, at least in part, a comparator. The signal within the lower noise region could be monitored by the microprocessor (perhaps after it has passed through an A/D). Again, an example of analysis could be monitoring, via signal value comparison, for a significant enough of a change to the amplitude of the lower noise region, in which case the circuit would then report arc event/condition for such lower noise region (in embodiments where more than one lower noise region is monitored concurrently, then such reporting would amount to a yes vote in the polling protocol that positively yields an arc alert only when at least a certain percentage of lower noise regions report positive for arc condition). In certain embodiments, an arc could be indicated by an increase in signal by a certain threshold or limit, e.g., a percentage of the immediate previous lower noise value (5%, 10%. 15%, 25%, 50%, 100%, 200%, 300%, as but a few of many possible examples).

As mentioned, monitoring lower noise regions for changes by itself helps to reduce false positives, but in order to further reduce false positives, more than one lower noise region could be examined, and an arc condition for the measured location of the power generation circuit could be indicated only when, e.g., at least a certain percentage (e.g., a predetermined polling percentage, such as at least 3/5, or at least a majority, at least 80%, at least 20%, as but a few of many examples) of such regions report an increase that is above the indicated limit. Different lower noise regions may, but typically will not, have different thresholds (e.g, the degree of jump in signal that leads to a positive "vote" for arc condition). Polling might be done only when at least one of the several lower noise regions reports positively for arc condition.

Figure 2:
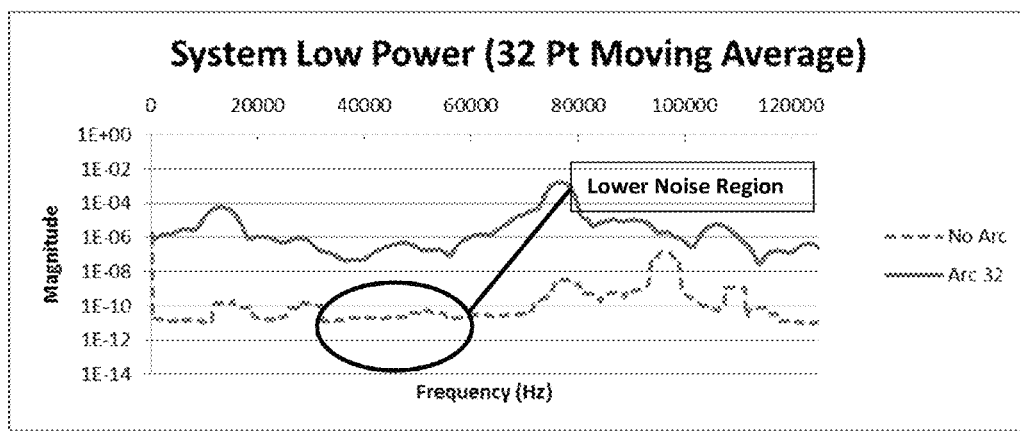
FIG. 2 shows an example of a graph of signal magnitude (unit-less) in the frequency domain for a photovoltaic system operating at low power.

Referring now to FIGS. 1 and 2, each shows arcing and non-arcing situations compared against each other; each also depicts signal response over a short window of time (note that the term time is not limited to simply an instant in time, but instead also may include windows of time). Indeed, in order to generate a fourier transform, more than one instantaneous measurement must be taken. Accordingly, the terms "non-arc condition time" and "later time" as used in the claims, where measurements at such times are then mathematically transformed, typically imply taking a plurality of instantaneous measurements over a period of time (e.g., a short period of time) to generate a corresponding signal. As such, measuring a parameter at a time to generate a signal that is then mathematically transformed implies making a plurality of instantaneous measurement over a window of time.

More particularly as to FIGS. 1 and 2, while each graphed signal is itself at a short window in time (as opposed to being precisely instantaneous), the arcing and non-arcing signals shown each occurred at a different time. Note further that the horizontal axis is hertz, while the vertical axis is a log scale, in decibels, of unit-less measurement of detector input (whether current, voltage, or power) magnitude in the frequency domain. The magnitudes shown are 32 point moving average magnitude of individual frequency values. The "first" 32 points (the smallest sampled frequencies, from left to right on the graph shown) could be either individual frequency values (instead of an average), or an average of all smaller frequency points (as but two possibilities). The $33^{rd}$ point would be the average of the values of the measured magnitudes for the respective 32 "immediately lower" frequencies, as would the $34^{th}$ frequency magnitude, the $35^{th}$ frequency, etc. The interval between points could be any of a multitude of possibilities (including but not limited to within the range of from 1 Hz to 1 MHz); the interval may be governed by the equipment used. Any number of samples can be taken including but not limited to from 1-1 million samples taken. Of course, the moving average is merely one type of manner by which to generate data that could be monitored to detect significant change suggesting arc; it is not a necessary feature to the inventive technology (indeed, fourier transforms that are not presented as moving averages may meet the data needs of the inventive technology). As to FIGS. 1 and 2, note that the non-arcing traces with the lowest signal levels (i.e., the least noise) produced the clearest results for detecting when the arc did occur by noticing the significant delta in signal; other higher noise/signal areas tended to hide or mask changes, not in small part because of the logarithmic scale of the graph and the significant increases in signal value with only moderate vertical increase in graph height.

Note that the detector may include a converter and/or may be in series with the converter (e.g., "piggy backing" off the converter); as such, it is expected that the current through the two components would be the same. Of further note is the fact that the detector is configured to measure the signal off of the wires in the PV system. Note that, as used herein, configured may mean established (e.g., electrically connected), designed, programmed, etc., to meet the indicated purpose, achieve the indicated function, or meet the indicated constraint; a system or component thereof (e.g., at least one microprocessor) may be configured to achieve any of the indicates steps of a disclosed method. The System Full Power graph (FIG. 1) shows how, at times, only a small portion of the range of sampled frequencies shows a change (an increase) during arc condition; the System Low Power graph (FIG. 2) shows how an arc may cause a difference in signal of a larger frequency range (as compared with the System Full Power graph). Differences in how a system's input current may react may be attributable to several factors, including but not limited to different locations of different arcs. If indeed, as with FIG. 1, the arc is such that it will cause a difference in signal in only a relatively small portion(s) of the sampled frequencies, it is anticipated that such differences will appear in the lower noise regions. Further, while signal differences typically appear in both low and higher noise regions, these differences are typically easier to correctly identify in lower noise regions. For these reason, it is these lower noise regions that are most closely monitored. Indeed, in certain embodiments, it is only the lower noise region(s) that are monitored.

Of particular note is an exemplary way by which the comparison between no arc and arc condition is made. Initially, during a non-arc condition (perhaps at initial system startup) at a non-arc condition time (e.g., a short duration time) when there is no arc present, one or more (preferably a plurality) of lower noise regions may be identified in the graph of converter input current in the frequency domain (e.g., mathematically transformed signals as illustrated in FIGS. 1 and 2). The system, regardless of how often locations of lower noise regions are updated or, generally, identified, may then identify a mathematically transformed, non-arc condition signal value for each of the lower noise region(s). Such identification may be done by re-determining such signal value every arc inquiry cycle (i.e., each current arc inquiry cycle), or instead may be done less frequently; such identification may involve analysis of a selected mathematically transformed non-arc condition signal (which includes a plurality of signal in a small band). In the baseline method, a signal may be selected for every lower noise region from once every two or more cycles; in the continually updated approach, a signal may be selected once every time period (that is equal to or greater than the time period occupied by one cycle). Either type of identification may involve the recall of a value(s) stored in memory (even if only for a short time, such as the time between measurements in an arc inquiry cycle that involves measurements at more than one time). Note that in order to retain detection accuracy, it may be necessary that within any single arc inquiry cycle, the lower noise regions (i.e., the frequencies that frame and locate them) are the same. Note also that whenever storage of data in memory occurs, it has been effected by a microprocessor (e.g., containing a CPU), typically programmable; microprocessor is a broad term that includes any electrical component that is able to handle, manipulate, transfer, process digital data. Further, where a microprocessor is said to be configured to achieve some functionality, it is not necessary that the same one microprocessor performs all indicated functions.

In the case where such identification of values is done less frequently than every arc inquiry cycle as described above, the system may generate anticipated "non-arc" condition baseline value(s) for such lower noise regions (e.g., mathematically transformed measured signals during non-arc condition time), perhaps via averaging/integrating the mathematically transformed signal values for the non-arc condition (at the non-arc condition time) over a short time period. In such embodiments, such baseline value(s) then serve as reference data against which later (any future) real time measurements for more than one arc inquiry cycle can be compared; significant differences between the two (within a small enough time elapse) may point to arcing condition. Because such baseline, "no arc" condition values may change for reasons other than arc (e.g., because of power ramp up), such baseline needs to be recalibrated on a regular basis (by selecting an appropriate non-arc condition signal). Possible time values include, but are not limited to, every 30 seconds, every few minutes, every 10 arc inquiry cycles, every 1000 arc inquiry cycles, every 10E4 arc inquiry cycles, etc (note that the variable "n" starts at 1 and increases by 1 after the completion of every single arc inquiry cycle; after power up, the first cycle may involve comparison of a later signal with a non-arc condition measured signal (e.g., taken at power up, or later, perhaps in an updating scheme). In embodiments described in terms of n, where n is 1 during that first cycle and increases by 1 after each cycle, and where mathematically transformed, non-arc condition signal values are updated every new cycle, non-arc condition time could be a $n^{th}$ time (e.g, first, second, third, etc.) and the later time could be a $(n+1)^{th}$ time (second, third, fourth, etc, respectively). Note that, as mentioned, updating the value to which the mathematically transformed $(n+1)^{th}$ signal is compared (at each of the lower noise regions) can be done either less frequently than every single arc inquiry cycle (e.g., using a baseline value for every lower noise region), or it can be done as frequently as every single arc inquiry cycle (in which case the appropriate $(n+1)^{th}$ signal value (at each of the lower noise region(s)) is compared with the $n^{th}$ signal value (at the respective lower noise region(s)). Either is a type of "identifying" the mathematically transformed, non-arc condition signal value for each of the lower noise region(s) (whose location may also be updated every arc inquiry cycle, or less frequently). Regardless, in those systems where it is done less frequently than every single arc inquiry cycle, the step of identifying the mathematically transformed, non-arc condition signal value for each lower noise region(s) may involve the recall of a mathematically transformed, non-arc condition signal value that was determined (e.g., "read" from a signal output, display or ascertained in other known fashion) and subsequently stored as necessary, more than 1 cycle ago (e.g., at a $(n-y)^{th}$ time, where "y" is an integer that is equal to or less than the aforementioned "x", and that may increase by 1 every cycle, up to a certain maximum value (e.g., a preset value, that is less than or equal to "x"), at which point the mathematically transformed, non-arc condition signal value is updated via measurement and analysis as described elsewhere herein.) Such earlier determination was typically done via analysis of a mathematically transformed, non-arc condition measured signal from such prior cycle. Recall that in certain embodiments, a lower noise region used for a certain detection cycle may have been determined during analysis of a $(n-x)^{th}$ mathematically transformed signal (where n is an integer). In embodiments where either or both of the location of the lower noise region(s) and the value of the associated mathematically transformed, non-arc condition signal value is used for more than one cycle (and updated as desired), other than a requirement, in certain preferred such embodiments, that the lower noise region(s) at which a mathematically transformed later signal is determined is the same lower noise region(s) at which a mathematically transformed non-arc condition signal value is determined, the rates of and times at which the location of the lower noise region(s) is updated and the value of the mathematically non-arc condition is updated may be viewed as being independent.

Regardless, if the time between recalibration/remeasurement is too large (which is more of a problem with recalibration/remeasurement that's done less frequently than every arc inquiry cycle), then false positives may result, as the difference between the signal value at a lower noise frequency range and the no-arc condition value (whether it be the baseline value or the $n^{th}$ value of that cycle (e.g., the $(n+1)^{th}$ value for that cycle), for that lower noise frequency range, may be attributable to something other than arc (e.g., intentional power ramp up or ramp up for other reason).

As mentioned, an alternative (alternative to the baseline method described immediately above) but related manner by which to detect arc condition is to monitor a lower noise region continuously, compare mathematically transformed signals (e.g., $(n+1)^{th}$ signals) to immediately prior signals ($n^{th}$ signals) and determine if the change therebetween is significant enough to suggest arcing. Such immediately prior measured signals may provide the most accurate, real time representation of the system's arc related behavior for the $(n+1)^{th}$ time. Note that in such embodiments, it may be particularly convenient to use the mathematically transformed, $(n+1)^{th}$ signal value (for each lower noise region) for one arc inquiry cycle as the non-arc condition signal value for the next arc inquiry cycle (for the respective same lower noise region); as such, such $(n+1)^{th}$ signal value for the earlier cycle may be used as the $n^{th}$ signal value for the next (in time) cycle. Accordingly, performance of certain steps involving a $n^{th}$ signal value may have been performed during the prior cycle (but relative to the $(n+1)^{th}$ signal value). Note that when repeating steps of a single arc inquiry cycle (so that the circuit is continually monitoring for presence of arc during the operation of the power generation circuit, which is the typical employment of the method), for all but the very first cycle, the "$n^{th}$" steps of a new cycle have typically already been performed, as they are some of the "$(n+1)^{th}$" steps of the immediately previous cycle; such steps are typically not performed twice and their representation in the claims is not to be construed as requiring double performance of such steps. Of course, an appropriate time period between such measurements must be chosen—if it is too large, then false positives may result (because an observed change may be attributable to a non-arc condition such as intentional power ramp up). For the chosen measurement time interval, it must be determined what would be the largest change in input current that would be caused by a non-arc condition. Changes that are larger than that would suggest arcing.

It should be clear that the inventive technology, in certain aspects, presents two major, substantially independent options: (1) updating the location of the lower noise region(s) as often as desired (even as often as once every arc inquiry cycle; in other words, as often as before every the non-arc condition, mathematically transformed signal is measured); and (2) updating the value of the mathematically transformed, non-arc condition signal as often as desired (e.g., at the lower noise regions every cycle or less frequently). Both, or either, may be used in certain embodiments. The may be related as described above, but otherwise independent.

Figure 3:
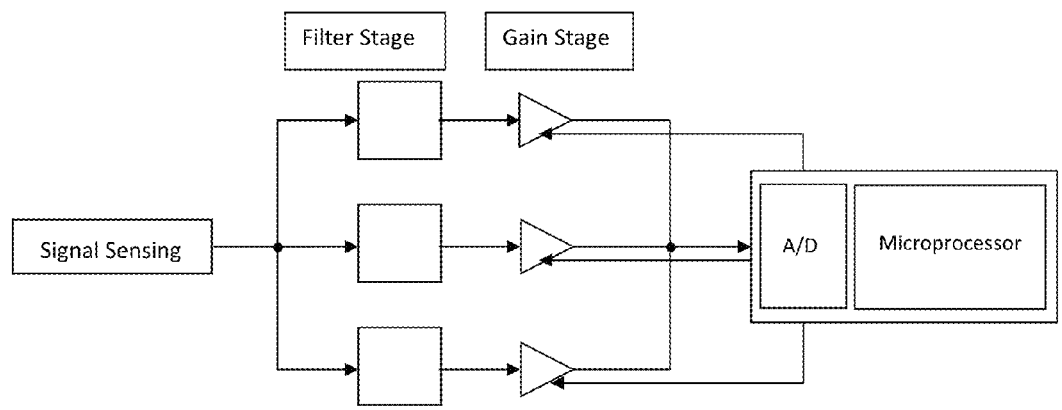
FIG. 3 shows an example of an embodiment of the inventive detection circuit technology disclosed herein.

Regardless of how arcing is detected, the detection circuit's microprocessor or chip could also be programmable to decide what to do after the arc has occurred, and what sort of action to automatically take; as such it could be automatic, positive arc condition response circuitry, or form a part thereof. For example it could activate more circuitry (which may form part of the automatic, positive arc condition response circuitry) to extinguish the arc or send a flag to an external monitoring system. The circuit could also be designed to interact with other solar system components such as panels, relays, string combiners, and DC/DC converters for example. The circuit could also be designed to either wait for a reset flag before it starts to monitor again, or reset on through its own means via a time delay. Once an arc is detected, readings from the affected circuit may be terminated; at the very least, they would not be used to determine any non-arc condition signal values. The circuit should also contain nonvolatile memory so that it can remember its state when a loss of power occurs. An example of such a circuit is illustrated in FIG. 3. This, or other memory (e.g., as part of a microprocessor, whether in this or a different circuit), could be used as necessary to store any values (e.g., locations of lower noise region(s) and/or values of signals at such region(s)) that are necessary for the comparison of values used to determine the presence of arc, or for other reasons.

Figure 4:
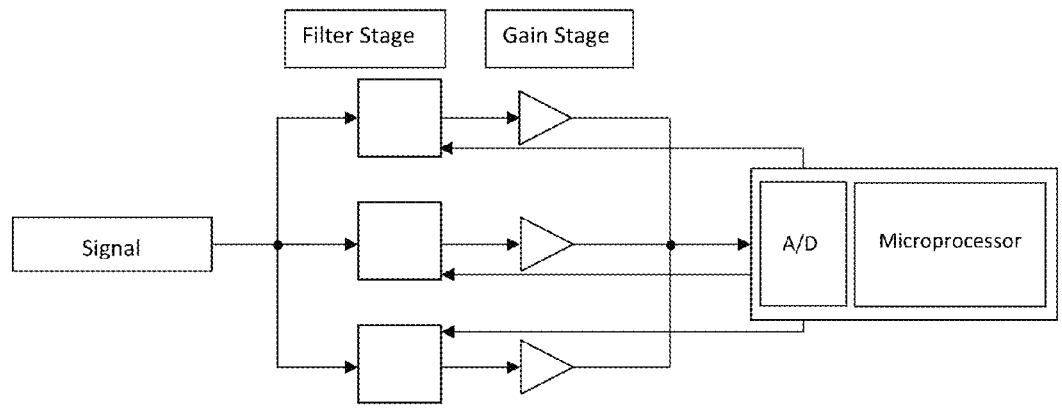
FIG. 4 shows an example of an embodiment of the inventive detection circuit technology disclosed herein.

A similar circuit that could be used to achieve the same results could be to have a programmable filter stage that would be able to sweep narrow band-pass filters across regions looking for the most desirable analysis region dictated by the microprocessor. An example of such a circuit is shown in FIG. 4. Both circuits (FIG. 3 and FIG. 4) would produce a signal usable by the same algorithm in the microprocessor, and a combination of both topologies would also be possible.

Combing this circuitry with a microprocessor and A/D would provide a very reliable system for detecting the difference between an arcing event and a non-arcing event. This provides very high detection capability. This circuit could also be capable of handling more than one signal via analysis on these signals. The results could help decide between an arcing and non-arcing event. For example, the circuit could be on a string combiner monitoring two or more strings, and analyzing the difference in behavior between the two or more strings.

Figure 5:
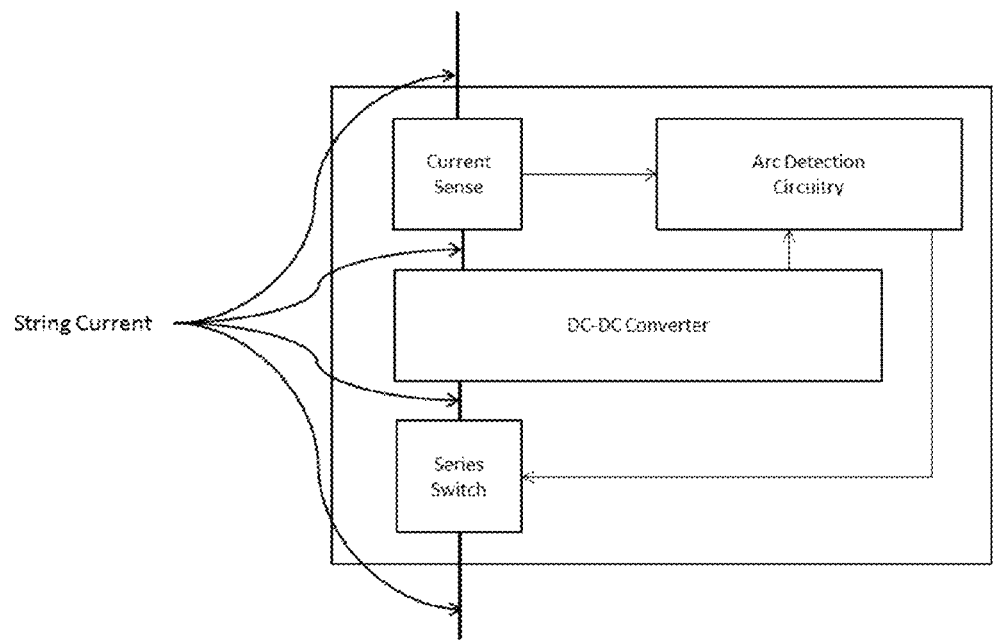
FIG. 5 shows an example of an embodiment of the inventive detection circuit technology disclosed herein as it may be configured relative to one of many DC-DC converters of a photovoltaic system; it also shows a series switch that affords the detection circuitry the ability to interrupt flow as appropriate.

Any of the circuitry disclosed herein could also have the ability to sense or measure the current (or other parameter), and could be powered by such current as well (see, e.g., FIG. 5), or a converter of the circuit (as but two examples of self powering); instead it could be powered externally by a battery. The term power source 22 is broad and includes the operating power generation circuit itself (e.g., converters) and external power sources. The power source may be configured (e.g., connected) to power the circuit or any of the circuit's components that need power to function.

When connected in series with a string of photovoltaic panels, or any type of distributed DC-DC power converters, the circuit could use the current in the series string in conjunction with a DC-DC converter to power the circuitry on board which may include, without limitation: arc detection circuitry, power line communication circuitry, or even wireless circuitry. The arc detection circuitry would then be able to communicate wirelessly or through power line communications with other circuitry or a communication station. Once an arc is detected, the device would then have the ability to cease current flow via a series switch that could be mechanical, or semiconductor based, for example (see, e.g., FIG. 5). It is of ancillary note that any of the methods and apparatus disclosed herein could apply to any circuit where arc was of concern (not just a power generation circuit).

It is of additional note that the inventive technology may be described as broadly as generating a non-arc condition fourier transform from a series of instantaneous parameter measurements at non-arc condition time (time window) and first location of a power generation circuit, generating a later fourier transform from a series of instantaneous parameter measurements at a later time (time window) and the first location of the power generation circuit, comparing the two fourier transforms, and then making a determination as to presence of arc based on such comparison. This may be repeated; it may be implemented at several locations in order to more comprehensively monitor the circuit for arc or other abnormality. Other possible aspects of this articulation of this inventive technology (e.g., comparison of signal values at lower noise region(s) of the two transform signals; updating of lower noise region locations; updating of non-arc condition, fourier transformed signal values, etc.) may be as described elsewhere in this disclosure. A related apparatus, where a circuit includes componentry configured to achieve related functions, is also considered part of the inventive technology.

String Voltage Based Arc Detection Strategies:

In a photovoltaic system, it is also possible to perform arc detection with high precision measurements and precisely synchronized data collection via distributed DC-DC converters. Generally, such a circuit may be referred to as an intra-string electrical arc detection circuit; it may include a voltage measurer (e.g., any known voltage measurer configured to measure the voltage of a string, or a series of measurers (e.g., converters that report voltages across a module)), a comparator (anything, including but not limited to a programmed microprocessor that is able to compare values and accomplish other related tasks as necessary), and automatic, positive arc condition response circuitry that acts in the event arc is detected. These components may be as shown, or subcomponents of devices shown, in FIG. 5.

In a properly functioning (including non-arcing) photovoltaic system, the voltage between two or more parallel connected strings will be equal. In some photovoltaic systems the voltage is dictated by a device connected in parallel with the strings, such as an inverter, for example. When the strings include photovoltaic panels, the voltages produced by the photovoltaic panels will sum together to deliver the voltage demanded by the inverter in parallel. In a normally behaving photovoltaic system, the summation of the reported voltages from the series connected DC-DC converters should be equal among their parallel connected strings as well. When a series arc occurs in one of the series string connections, the photovoltaic panels must now deliver more voltage to compensate for the voltage drop across the arc. Due to the nature of an arc, it requires voltage and current to be sustained, and such voltage increases as the distance of the arc increases. In some cases the voltage drop across the arc can be as high as 50V, while having very low current to be sustained.

Figure 6:
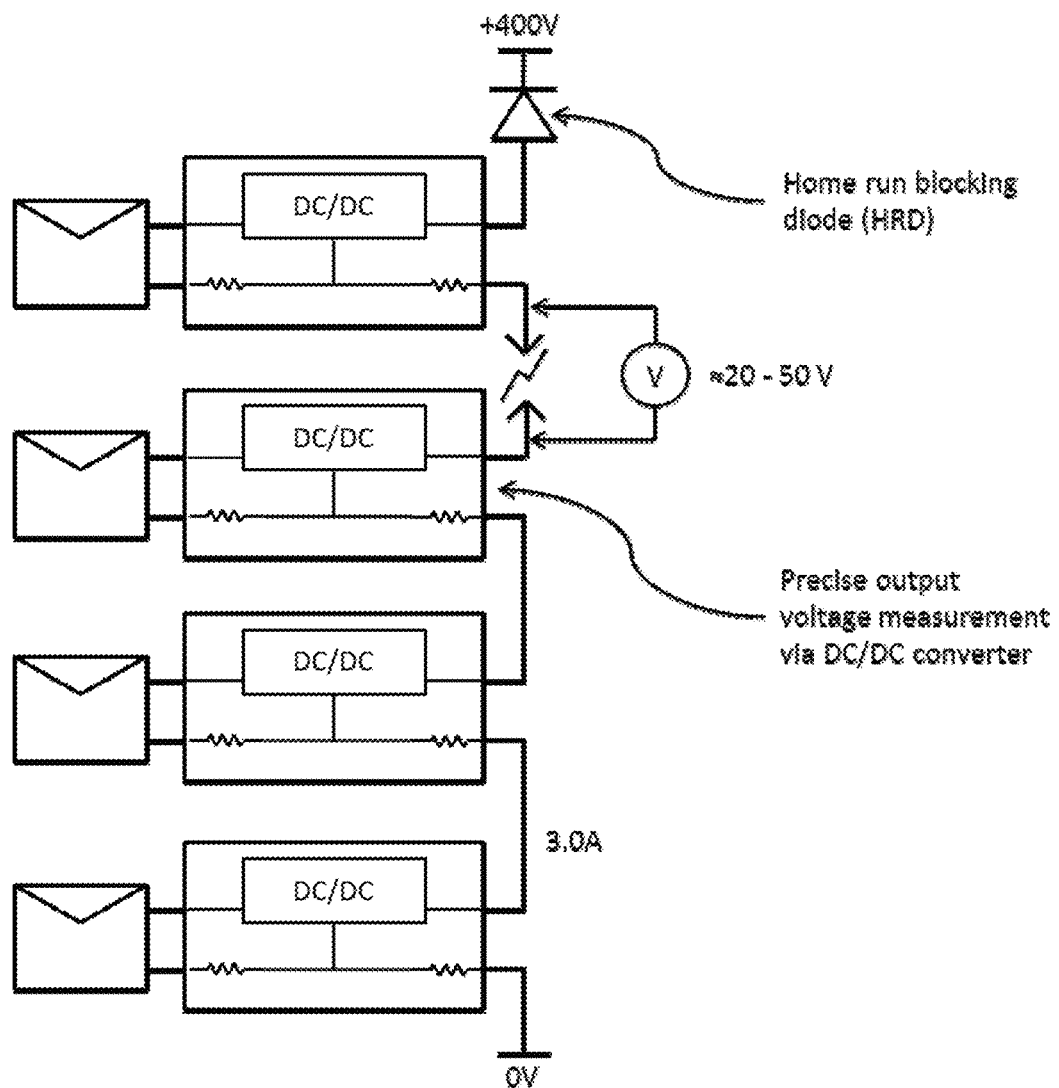
FIG. 6 shows one possible location of arcing in a PV system having distributed DC-DC power converters. It also shows intra-string measurement of voltages associated with each module; such voltages may be summed to generate a total string voltage, which then may be compared via a comparator, for example, with a prescribed string voltage to determine the presence of arc.
Figure 7A:
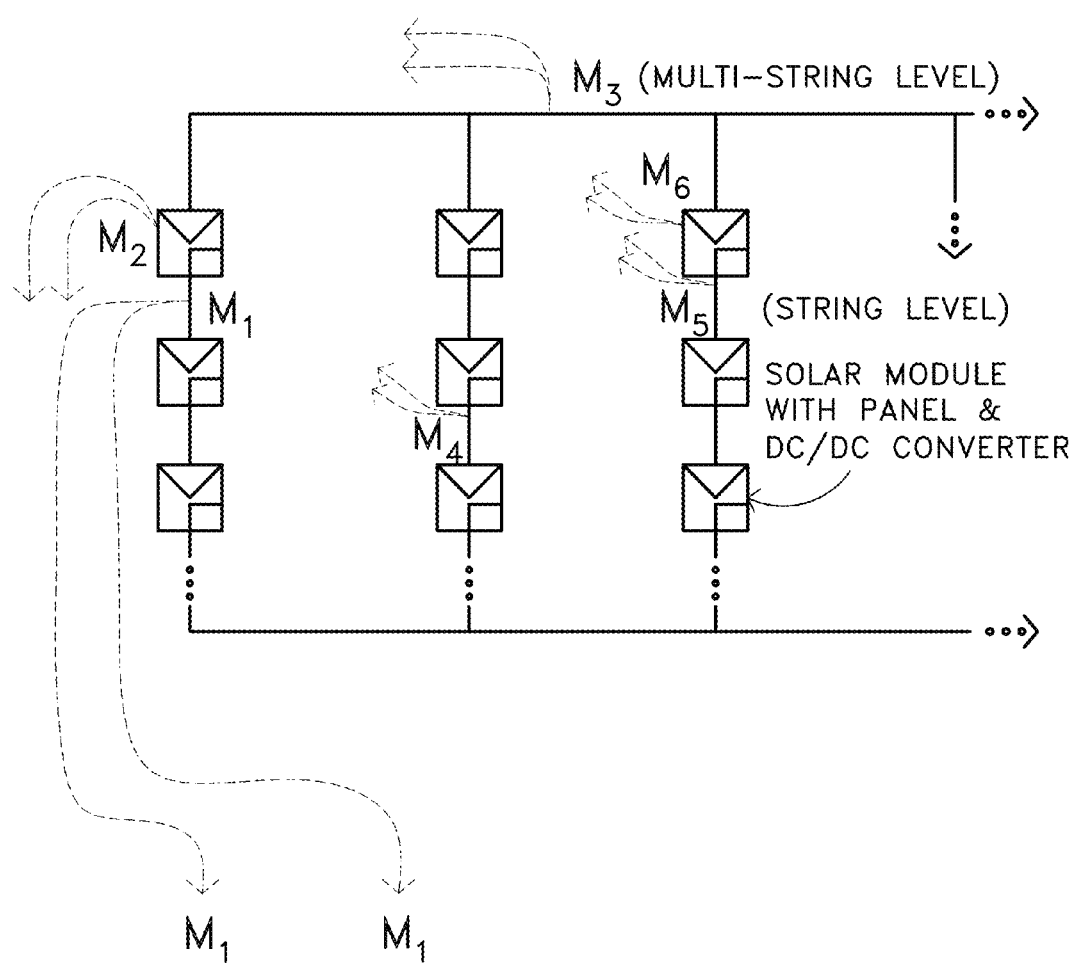
FIGS. 7A and B shows a step driven schematic for a possible embodiments of the inventive technology involving comparison of a $(n+1)^{th}$ time signal value with non-arc condition time (e.g., $n^{th}$) time signal values for each lower value noise regions in order to determine whether an arc is present at the measured location within the power generation circuit. Of course, this (and other figures) depicts only some possible embodiments of the many different manifestations of the inventive technology (others may involve comparison of $(n+1)^{th}$ time signal values with signal values at times other than the $n^{th}$ time (i.e., earlier times)). Note that M (e.g., $M_1$ and $M_2$) imply measurements taken at different locations ($M_1$ relates to one location and $M_2$ at another location); the figures show steps relative to only one location ($M_1$) but of course this protocol may take place at other locations. Often the times of measurement are the same among all measured locations (which allows for precise energy accounting, particularly with measurement at a comprehensive set of locations), but in some embodiments, such as those interested in system behavior at only a few locations, this might not be necessary.
Figure 7B:
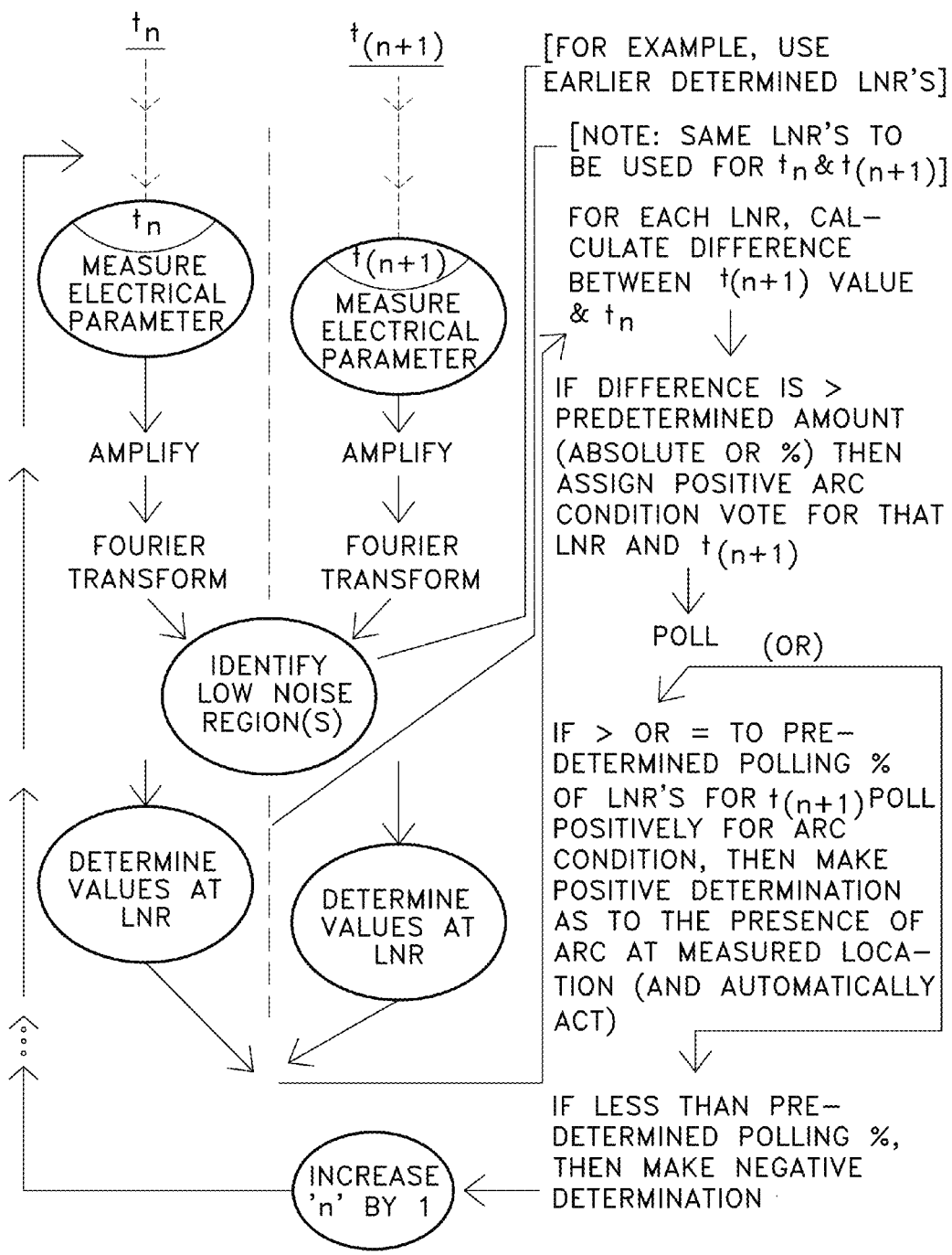
Figure 8:
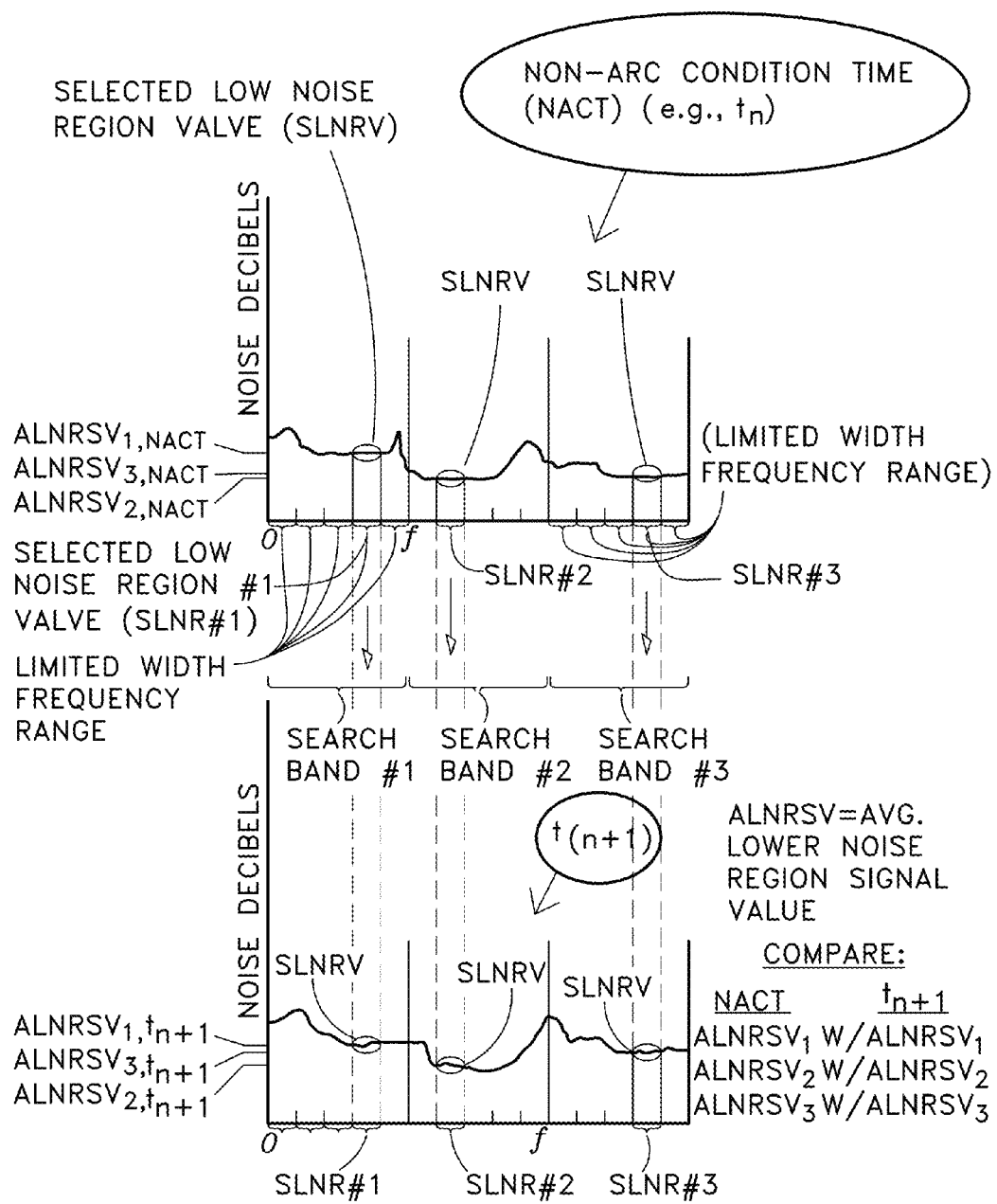
FIG. 8 shows mathematically transformed signal graphs (generated through use of an appropriately programmed microprocessor(s)) for a first non-arc condition time and a later time (e.g., $t_{(n+1)}$). It particularly shows aspects of a comparison between values at different lower noise regions whose results may be polled to assess or determine the presence of arc.

The condition is the same if distributed DC-DC power converters are introduced into the system, but now precise measurement devices may be added as well. An example of one such system is illustrated in FIG. 6 where the DC-DC converter may enable/contain precise voltage measurements on the output, and perhaps communication of such measurements. When a serial arc occurs on the output of the DC-DC converters, or in the series string connection, a 20-50 V drop can occur. This drop is only realized on the afflicted string, and thus results in the series connected converters of such string delivering a voltage higher than all the others strings in parallel with the afflicted string (the converters report a higher voltage because the converters compensate for the voltage drop created by the arc). By combining the precise measurements with precisely synchronized data, collected wirelessly or through the use of wires (e.g., via power line communications), it is possible to detect this serial arc and locate the afflicted string by comparing, with a comparator, the voltages among the strings (comparisons would be generally to a prescribed voltage). The comparator could determine whether any observed increase is large enough (atypically large) to warrant signaling automatic, positive arc condition circuitry to act. This method is not just limited to module level DC-DC converters, but can also be applied to other high precision intra-string measurement devices as well, so long as there is precise synchronized data. To have high precision measurements one may need to measure at measurement resolution tolerances of 1% or better, and to have precise synchronized data one may need to measure at 200 ms or less of time synchronization difference between measurement points. Arc may be present in a string when the voltage of that string is atypically greater (i.e., greater than that seen when string is in non-arc condition) than a prescribed string voltage (e.g., whether such prescribed string voltage is the voltage of strings connected in parallel with the string "under inquiry", or whether such prescribed voltage is merely the unmeasured voltage that such string, operating properly (e.g., without arc) should have, as designed). Differences suggesting arc (i.e., atypical differences) would be within the ken of one of ordinary skill in the relevant art. Atypical differences could be in absolute volts, or be expressed as percentage increases relative to the prescribed voltage.

FIG. 9 shows black box type depictions of various embodiments used on power generation circuit, the serially connected boxes of which are solar modules shown to optionally include DC/DC converters (represented as a nested box in the lower right hand portion of the module, as part of the module). As to the lower noise region measured signal embodiments, the left-most string shows an arc detection system powered by a converter of such string; the housed arc detection unit is shown as a black box connected to the string between serially connected modules. It contains an electrical parameter measurer and at least one microprocessor (note that the at least one microprocessor could be configured, perhaps with additional componentry as necessary, to measure an electrical parameter). It also may contain the automatic, positive arc condition response circuitry. The other two strings of FIG. 9 show string voltage based arc detection apparatus; the left most uses a voltage measurer across all serially connected modules while the right string has a voltage measurer that combines voltages reported (wirelessly in this example) by individual converters associated with a respective one of the serially connected modules (therefore, the converters and the box (marked 40, 41 and 42 at the upper portion of the right-most string) include voltage measurer componentry/circuitry).

It is of note that in any embodiment (of either the lower noise region or the string voltage based approaches to detect arc), when the afflicated string is located, any of a series of automatic actions can be taken, perhaps by automatic, positive arc detection response circuitry 23, 42, in accordance with a prescribed positive arc condition protocol (e.g., a flag can be set alerting a user to the detection and or location of the serial arc, thereby reducing down time of the photovoltaic system and increasing the safety of the system; a signal, whether wireless or otherwise, can be sent to an operator; the afflicted string can be shut down, etc.) The technique also makes it possible to automatically isolate and shutdown the afflicted string to prevent further damage and possible fire. This gives a user the option to keep the rest of the photovoltaic system running. Note that these actions can be taken also when an arc is detected using the method involving lower noise regions. Note that this voltage measurement based intra-string (within a string) measurement arc detection strategy can be combined with the aforementioned lower noise region based arc detection strategy to provide a redundant detection system.

As mentioned earlier, the present invention includes a variety of aspects, which may be combined in different ways. The following descriptions are provided to list elements and describe some of the embodiments of the present invention. These elements are listed with initial embodiments, however it should be understood that they may be combined in any manner and in any number to create additional embodiments. The variously described examples and preferred embodiments should not be construed to limit the present invention to only the explicitly described systems, techniques, and applications. Further, this description should be understood to support and encompass descriptions and claims of all the various embodiments, systems, techniques, methods, devices, and applications with any number of the disclosed elements, with each element alone, and also with any and all various permutations and combinations of all elements in this or any subsequent application.

The discussion included in this application is intended to serve as a basic description. The reader should be aware that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Apparatus claims may not only be included for the device described, but also method or process claims may be included to address the functions the invention and each element performs. Neither the description nor the terminology is intended to limit the scope of the claims that will be included in any subsequent patent application.

It should also be understood that a variety of changes may be made without departing from the essence of the invention. Such changes are also implicitly included in the description. They still fall within the scope of this invention. A broad disclosure encompassing both the explicit embodiment(s) shown, the great variety of implicit alternative embodiments, and the broad methods or processes and the like are encompassed by this disclosure and may be relied upon when drafting the claims for any subsequent patent application. It should be understood that such language changes and broader or more detailed claiming may be accomplished at a later date (such as by any required deadline) or in the event the applicant subsequently seeks a patent filing based on this filing. With this understanding, the reader should be aware that this disclosure is to be understood to support any subsequently filed patent application that may seek examination of as broad a base of claims as deemed within the applicant's right and may be designed to yield a patent covering numerous aspects of the invention both independently and as an overall system.

Further, each of the various elements of the invention and claims may also be achieved in a variety of manners. Additionally, when used or implied, an element is to be understood as encompassing individual as well as plural structures that may or may not be physically connected. This disclosure should be understood to encompass each such variation, be it a variation of an embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled. As but one example, it should be understood that all actions may be expressed as a means for taking that action or as an element which causes that action. Similarly, each physical element disclosed should be understood to encompass a disclosure of the action which that physical element facilitates. Regarding this last aspect, as but one example, the disclosure of a "detector" should be understood to encompass disclosure of the act of "detecting"—whether explicitly discussed or not—and, conversely, were there effectively disclosure of the act of "detecting", such a disclosure should be understood to encompass disclosure of a "detector" and even a "means for detecting" Such changes and alternative terms are to be understood to be explicitly included in the description. Further, each such means (whether explicitly so described or not) should be understood as encompassing all elements that can perform the given function, and all descriptions of elements that perform a described function should be understood as a non-limiting example of means for performing that function.

Any patents, publications, or other references mentioned in this application for patent are hereby incorporated by reference. Any priority case(s) claimed by this application is hereby appended and hereby incorporated by reference. In addition, as to each term used it should be understood that unless its utilization in this application is inconsistent with a broadly supporting interpretation, common dictionary definitions should be understood as incorporated for each term and all definitions, alternative terms, and synonyms such as contained in the Random House Webster's Unabridged Dictionary, second edition are hereby incorporated by reference. Finally, all references listed in the information statement filed with the application are hereby appended and hereby incorporated by reference, however, as to each of the above, to the extent that such information or statements incorporated by reference might be considered inconsistent with the patenting of this/these invention(s) such statements are expressly not to be considered as made by the applicant(s).

Thus, the applicant(s) should be understood to have support to claim and make a statement of invention to at least: i) each of the detection devices as herein disclosed and described, ii) the related methods disclosed and described, iii) similar, equivalent, and even implicit variations of each of these devices and methods, iv) those alternative designs which accomplish each of the functions shown as are disclosed and described, v) those alternative designs and methods which accomplish each of the functions shown as are implicit to accomplish that which is disclosed and described, vi) each feature, component, and step shown as separate and independent inventions, vii) the applications enhanced by the various systems or components disclosed, viii) the resulting products produced by such systems or components, ix) each system, method, and element shown or described as now applied to any specific field or devices mentioned, x) methods and apparatuses substantially as described hereinbefore and with reference to any of the accompanying examples, xi) an apparatus for performing the methods described herein comprising means for performing the steps, xii) the various combinations and permutations of each of the elements disclosed, xiii) each potentially dependent claim or concept as a dependency on each and every one of the independent claims or concepts presented, and xiv) all inventions described herein.

In addition and as to computer aspects and each aspect amenable to programming or other electronic automation, the applicant(s) should be understood to have support to claim and make a statement of invention to at least: xv) processes performed with the aid of or on a computer as described throughout the above discussion, xvi) a programmable apparatus as described throughout the above discussion, xvii) a computer readable memory encoded with data to direct a computer comprising means or elements which function as described throughout the above discussion, xviii) a computer configured as herein disclosed and described, xix) individual or combined subroutines and programs as herein disclosed and described, xx) a carrier medium carrying computer readable code for control of a computer to carry out separately each and every individual and combined method described herein or in any claim, xxi) a computer program to perform separately each and every individual and combined method disclosed, xxii) a computer program containing all and each combination of means for performing each and every individual and combined step disclosed, xxiii) a storage medium storing each computer program disclosed, xxiv) a signal carrying a computer program disclosed, xxv) the related methods disclosed and described, xxvi) similar, equivalent, and even implicit variations of each of these systems and methods, xxvii) those alternative designs which accomplish each of the functions shown as are disclosed and described, xxviii) those alternative designs and methods which accomplish each of the functions shown as are implicit to accomplish that which is disclosed and described, xxix) each feature, component, and step shown as separate and independent inventions, and xxx) the various combinations and permutations of each of the above.

With regard to claims whether now or later presented for examination, it should be understood that for practical reasons and so as to avoid great expansion of the examination burden, the applicant may at any time present only initial claims or perhaps only initial claims with only initial dependencies. The office and any third persons interested in potential scope of this or subsequent applications should understand that broader claims may be presented at a later date in this case, in a case claiming the benefit of this case, or in any continuation in spite of any preliminary amendments, other amendments, claim language, or arguments presented, thus throughout the pendency of any case there is no intention to disclaim or surrender any potential subject matter. It should be understood that if or when broader claims are presented, such may require that any relevant prior art that may have been considered at any prior time may need to be re-visited since it is possible that to the extent any amendments, claim language, or arguments presented in this or any subsequent application are considered as made to avoid such prior art, such reasons may be eliminated by later presented claims or the like. Both the examiner and any person otherwise interested in existing or later potential coverage, or considering if there has at any time been any possibility of an indication of disclaimer or surrender of potential coverage, should be aware that no such surrender or disclaimer is ever intended or ever exists in this or any subsequent application. Limitations such as arose in Hakim v. Cannon Avent Group, PLC, 479 F.3d 1313 (Fed. Cir 2007), or the like are expressly not intended in this or any subsequent related matter. In addition, support should be understood to exist to the degree required under new matter laws—including but not limited to European Patent Convention Article 123(2) and United States Patent Law 35 USC 132 or other such laws—to permit the addition of any of the various dependencies or other elements presented under one independent claim or concept as dependencies or elements under any other independent claim or concept. In drafting any claims at any time whether in this application or in any subsequent application, it should also be understood that the applicant has intended to capture as full and broad a scope of coverage as legally available. To the extent that insubstantial substitutes are made, to the extent that the applicant did not in fact draft any claim so as to literally encompass any particular embodiment, and to the extent otherwise applicable, the applicant should not be understood to have in any way intended to or actually relinquished such coverage as the applicant simply may not have been able to anticipate all eventualities; one skilled in the art, should not be reasonably expected to have drafted a claim that would have literally encompassed such alternative embodiments.

Further, if or when used, the use of the transitional phrase "comprising" is used to maintain the "open-end" claims herein, according to traditional claim interpretation. Thus, unless the context requires otherwise, it should be understood that the term "comprise" or variations such as "comprises" or "comprising", are intended to imply the inclusion of a stated element or step or group of elements or steps but not the exclusion of any other element or step or group of elements or steps. Such terms should be interpreted in their most expansive form so as to afford the applicant the broadest coverage legally permissible. The use of the phrase, "or any other claim" is used to provide support for any claim to be dependent on any other claim, such as another dependent claim, another independent claim, a previously listed claim, a subsequently listed claim, and the like. As one clarifying example, if a claim were dependent "on claim 20 or any other claim" or the like, it could be re-drafted as dependent on claim 1, claim 15, or even claim 25 (if such were to exist) if desired and still fall with the disclosure. It should be understood that this phrase also provides support for any combination of elements in the claims and even incorporates any desired proper antecedent basis for certain claim combinations such as with combinations of method, apparatus, process, and the like claims.

Finally, any claims set forth at any time are hereby incorporated by reference as part of this description of the invention, and the applicant expressly reserves the right to use all of or a portion of such incorporated content of such claims as additional description to support any of or all of the claims or any element or component thereof, and the applicant further expressly reserves the right to move any portion of or all of the incorporated content of such claims or any element or component thereof from the description into the claims or vice-versa as necessary to define the matter for which protection is sought by this application or by any subsequent continuation, division, or continuation-in-part application thereof, or to obtain any benefit of, reduction in fees pursuant to, or to comply with the patent laws, rules, or regulations of any country or treaty, and such content incorporated by reference shall survive during the entire pendency of this application including any subsequent continuation, division, or continuation-in-part application thereof or any reissue or extension thereon.

What is claimed is:

1. An electrical arc detection method comprising the steps of:
   measuring, through use of an electrical parameter measurer, an electrical parameter at a location within a power generation circuit at a non-arc condition time to generate a non-arc condition measured signal; and
   using at least one microprocessor to:
   mathematically transform said non-arc condition measured signal to generate a mathematically transformed, non-arc condition signal;
   identify at least one lower noise region of said mathematically transformed, non-arc condition signal;
   identify a mathematically transformed, non-arc condition signal value for each of said at least one lower noise region;
   measure said electrical parameter at said location within said power generation circuit at a later time to generate a later measured signal;
   mathematically transform said later measured signal to generate a mathematically transformed later signal;
   determine a value of said mathematically transformed later signal at each of said at least one lower noise region;
   compare said value of said mathematically transformed later signal at each of said at least one lower noise region with said mathematically transformed, non-arc condition signal value at a respective one of said at least one lower noise region; and
   make a determination relative to presence of arc within said power generation circuit;
   reevaluate to determine whether said at least one lower noise region of said mathematically transformed, non-arc condition signal is still lower noise;
   determine that said at least one lower noise region is no longer lower noise; and
   update said at least one lower noise region to an updated at least one lower noise region.

2. An electrical arc detection method as described in claim 1 wherein said step of using at least one microprocessor to mathematically transform comprises the step of using said at least one microprocessor to fourier transform to generate a frequency domain signal.

3. An electrical arc detection method as described in claim 2 wherein said step of using at least one microprocessor to mathematically transform comprises the step of using said at least one microprocessor to fourier transform to generate a spectral density.

4. An electrical arc detection method as described in claim 1 further comprising the steps of using said at least one microprocessor to:
   identify an updated, mathematically transformed, non-arc condition signal value for each of said updated at least one lower noise region;
   measure said electrical parameter at said location within said power generation circuit at a later time to generate an updated, later measured signal;
   mathematically transform said later measured signal to generate an updated, mathematically transformed later signal;
   determine a value of said updated, mathematically transformed later signal at each of said updated at least one lower noise region;
   compare said value of said updated, mathematically transformed later signal at each of said updated at least one lower noise region with said updated, mathematically transformed, non-arc condition signal value at a respective one of said updated at least one lower noise region; and
   make an additional determination relative to presence of arc within said power generation circuit.

5. An arc detection circuit comprising:
   an electrical parameter measurer configured to measure an electrical parameter at a location within a power generation circuit at a non-arc condition time and a later measurement time to generate a non-arc condition measured signal and a later measured signal;
   at least one microprocessor configured to:
   mathematically transform said non-arc condition measured signal to generate a mathematically transformed, non-arc condition signal;
   identify at least one lower noise region of said mathematically transformed, non-arc condition signal;
   identify said mathematically transformed, non-arc condition signal value for each of said at least one lower noise region;
   mathematically transform said later measured signal to generate a mathematically transformed later signal;
   determine a value of said mathematically transformed later signal at each of said at least one lower noise region;
   compare said value of said mathematically transformed later signal at each of said at least one lower noise region with said mathematically transformed, non-arc condition signal value at a respective one of said at least one lower noise region;
   make a determination relative to presence of arc within said power generation circuit,
   reevaluate to determine whether said at least one lower noise region of said mathematically transformed, non-arc condition signal is still lower noise;
   determine that said at least one lower noise region is no longer lower noise; and
   update said at least one lower noise region to an updated at least one lower noise region,
   said circuit further comprising a power source configured to power said at least one microprocessor.

6. An arc detection circuit as described in claim 5 wherein said at least one microprocessor is further configured to:
   identify an updated mathematically transformed, non-arc condition signal value for each of said updated at least one lower noise region;
   measure said electrical parameter at said location within said power generation circuit at a later time to generate an updated, later measured signal;
   mathematically transform said later measured signal to generate an updated, mathematically transformed later signal;
   determine a value of said updated, mathematically transformed later signal at each of said updated at least one lower noise region;
   compare said value of said updated, mathematically transformed later signal at each of said updated at least one lower noise region with said updated, mathematically transformed, non-arc condition signal value at a respective one of said updated at least one lower noise region; and
   make an additional determination relative to presence of arc within said power generation circuit.

* * * * *